US006836160B2

(12) United States Patent
Li

(10) Patent No.: US 6,836,160 B2
(45) Date of Patent: Dec. 28, 2004

(54) MODIFIED BROKAW CELL-BASED CIRCUIT FOR GENERATING OUTPUT CURRENT THAT VARIES LINEARLY WITH TEMPERATURE

(75) Inventor: Xuening Li, Cary, NC (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 10/299,376

(22) Filed: Nov. 19, 2002

(65) Prior Publication Data

US 2004/0095187 A1 May 20, 2004

(51) Int. Cl.[7] ............................ G05F 3/30; H03K 17/14

(52) U.S. Cl. ........................ 327/103; 327/513; 327/538; 323/315

(58) Field of Search ................................. 327/103, 108, 327/361, 513, 538, 539; 323/313, 314, 315

(56) References Cited

U.S. PATENT DOCUMENTS 4,789,819 A * 12/1988 Nelson ........................ 323/314
5,394,078 A 2/1995 Brokaw ........................ 323/313
5,666,046 A 9/1997 Mietus ........................ 323/313
5,926,062 A * 7/1999 Kuroda ........................ 327/538
5,952,873 A 9/1999 Rincon-Mora .............. 327/539
6,002,293 A 12/1999 Brokaw ........................ 327/540
6,078,208 A * 6/2000 Nolan et al. ................ 327/512
6,091,286 A 7/2000 Blauschild .................. 327/543
6,157,245 A 12/2000 Rincon-Mora .............. 327/539
6,232,829 B1 5/2001 Dow ............................ 327/539
6,271,710 B1 * 8/2001 Ooishi ........................ 327/512
2004/0066180 A1 * 4/2004 Harrison ...................... 323/312

FOREIGN PATENT DOCUMENTS

EP 0492117 A3 11/1991 ............. G05F/3/22

* cited by examiner

*Primary Examiner*—Timothy P. Callahan
*Assistant Examiner*—Terry L. Englund
(74) *Attorney, Agent, or Firm*—Allen, Dyer, Doppelt, Milbrath & Gilchrist, P.A.

(57) ABSTRACT

A modified Brokaw cell-based circuit produces a current which varies linearly with temperature. The collector-emitter current flow path of a diode-connected transistor is connected in series with the PTAT current produced by a control transistor. The base of the control transistor receives a control voltage whose value defines a limited range of variation of output current with temperature. The output transistor is coupled to an input port of a current mirror, which mirrors the linear collector current from the output transistor. The current through the output transistor is controlled by a composite of a CTAT base-emitter voltage of the diode-connected transistor and a PTAT voltage across a resistor, so that the output transistor produces an output current having a linear temperature coefficient.

4 Claims, 2 Drawing Sheets

MODIFIED BROKAW CELL-BASED CIRCUIT FOR GENERATING OUTPUT CURRENT THAT VARIES LINEARLY WITH TEMPERATURE

FIELD OF THE INVENTION

The present invention relates in general to electronic circuits and components therefore, and is particularly directed to a new and improved voltage-controlled, modified Brokaw cell-based current generator, which is operative to generate an output current that exhibits a linear temperature coefficient.

BACKGROUND OF THE INVENTION

A variety of electronic circuit applications employ one or more voltage and/or current reference stages to generate precision voltages/currents for application to one or more loads. In order to accommodate parameter (e.g., temperature) variations in the environment in which the circuit is employed, it is often desirable that the reference circuit's output conform with a prescribed behavior. In the case of a voltage reference, for example, it is common practice to employ a precision voltage reference element, such as a 'Brokaw' bandgap voltage reference circuit, from which an output or reference voltage having a relatively flat temperature coefficient may be derived.

A reduced complexity circuit diagram of such a Brokaw bandgap voltage reference circuit is shown in FIG. 1 as comprising a pair of bipolar NPN transistors Q1 and QN, having their bases connected in common and to a bandgap voltage ($V_{BG}$) output node 11. In a typical integrated circuit layout, transistors QN and Q1 are located adjacent to one another and differ only in terms of the geometries by their respective emitter areas by a ratio of N:1. Alternatively, transistor QN may correspond to a plurality of N transistors coupled (or 'lumped') in parallel. The collectors of transistors QN and Q1 are coupled to respective ports 21 and 22 of a current mirror 20. The current mirror and amplifier makes an equal current flowing though the collector of QN and Q1. Transistor Q1 has its base-emitter junction voltage $Vbe_{Q1}$ derived from the series connection of the base-emitter junction of transistor QN and resistor R1, and its emitter Q1*e* coupled to the current summation node 12. Current summation node 12 is coupled through a resistor R2 to ground.

In the Brokaw cell voltage reference circuit of FIG. 1, the voltage on the R1 is equal to the VBE difference of the transistor Q1 and QN, which is proportional to absolute temperature (or PTAT) and is definable as (kT/q)lnN, where k is Boltzman's constant, q is the electron charge, T is temperature (in degrees Kelvin), N is the ratio of the emitter areas of transistors QN/Q1. The PTAT current 11 supplied through the resistor R2 produces a PTAT voltage thereacross, which is (2*R2/R1)*(kT/q)*lnN, where R1 and R2 are the resistance of resistor R1 and R2 respectively. This PTAT voltage $V_{PTAT}$ is summed with the VBE voltage across transistor Q1 (which is complementary to absolute temperature or CTAT), to derive an output voltage reference $V_{BG}$ at output terminal 11. As shown in FIG. 2, the output reference voltage $V_{BG}$ produced by the Brokaw bandgap reference circuit of FIG. 1 has a first-order compensated temperature coefficient, which typically varies in a 'squeezed', generally parabolic manner between 20 to 100 ppm/° C.

In addition to the need for circuits that exhibit an essentially flat voltage vs. temperature characteristic, such as the Brokaw voltage reference described above, there are a number of applications where it is desired that an output current vary in a prescribed manner with change in temperature. For example, in the case of a battery charger, it may be desirable to generate an output current that exhibits a well defined linear slope over a given temperature range for the thermal fold back.

SUMMARY OF THE INVENTION

In accordance with the invention, this objective is realized by employing the temperature dependency functionality exhibited within the circuitry used to generate Brokaw voltage reference, so as to realize a modified Brokaw cell-based circuit that produces an output current whose temperature coefficient varies linearly with temperature. In the modified Brokaw cell based circuit of the invention, Q1 and QN is exchangeable. The collector-emitter current flow path the transistor QN of the Brokaw circuit of FIG. 1, rather than being connected to the current mirror port, is connected to a diode connection in series with the collector-emitter current flow path of a control transistor. The base of the input transistor is coupled to receive an input or 'reference' (control) voltage VREF, whose value defines a limited linear range of variation of output current with temperature. The collector of the output transistor Q1 is coupled to an input port of a current mirror, which mirrors the collector current from output transistor at an output port thereof.

Unlike the conventional Brokaw circuit of FIG. 1, whose output is 'voltage' and whose input is a 'current' supplied by a current mirror connected to two the legs of the voltage reference circuit, the output of the modified Brokaw circuit of the invention is a 'current' that varies linearly with temperature, and its input is a control 'voltage' applied to the base of its control transistor. For a given reference voltage applied to its base, the control transistor will produce a prescribed (PTAT) output current, which is applied to the collector-emitter current flow path of the diode-connected transistor QN and thereby to the series connected resistors R1 and R2. The collector current of the output transistor Q1 is defined in accordance with the sum of the voltage drop $V_{R1}$ across the resistor R1 and the base emitter voltage $Vbe_{QN}$ of transistor QN. Since the voltage variation across the resistor R1 is PTAT (and is dominant) and that of the $Vbe_{QN}$ of transistor QN is CTAT, the resultant Vbe of the output transistor is the sum of a dominant PTAT component and a CTAT component, and has a linear temperature coefficient.

Operational conditions, such as slope and DC offset, of the current generator of the invention may be selectively defined in accordance one or more parameters or relationships among parameters of the circuit. For example, the slope of the linear variation of the output current with temperature may be varied by varying the ratio of the emitter areas of transistors Q1 and QN and/or by the ratio of the values of resistors R1/R2. For a given temperature, the output current may be varied by changing the magnitude of the control voltage applied to the base of the control transistor.

The ability of the invention to produce an output current that exhibits a very linear variation with temperature makes its readily adaptable to a variety of applications requiring customized temperature-based current behavior characteristics. For example, multiple current generators of the present invention having different parameter settings may be combined to produce a composite piecewise linear variation with temperature. As a non-limiting example, a first output current whose variation with temperature has a zero slope may be combined with a second output current having a substantial non-zero slope over its linear temperature variation, to produce a piecewise flat then inclining or declining variation with temperature current behavior.

DETAILED DESCRIPTION

Figure 3:
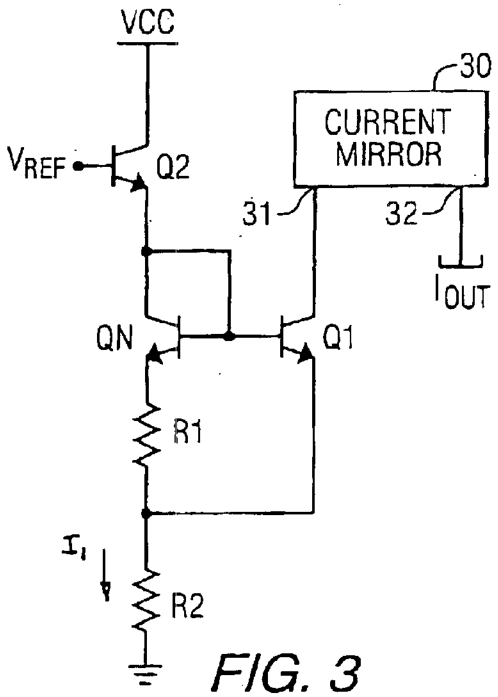
FIG. 3 is a circuit diagram of an embodiment of modified Brokaw cell-based circuit in accordance with of the present invention.
Figure 4:
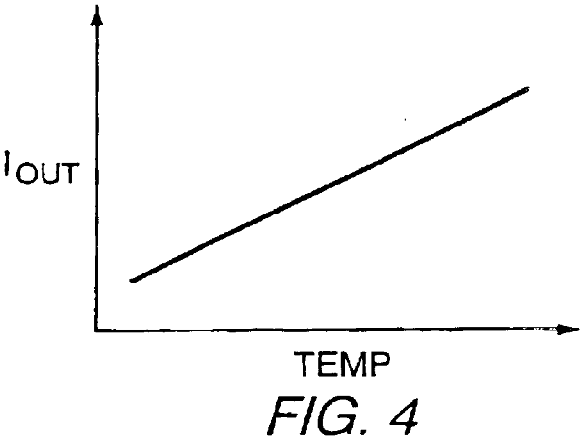
FIG. 4 shows the linear variation with temperature of the output current produced by the circuit of FIG. 3.

Attention is now directed to the circuit diagram of FIG. 3, which shows an embodiment of modified Brokaw cell-based circuit in accordance with of the present invention, that produces an output current having a very linear temperature coefficient. As shown in FIG. 4, that produces an output current having a very linear temperature, the current generator of FIG. 3 produces a linear output current $I_{out}$ having a positive temperature coefficient that varies linearly with temperature, (which is mirrored off the collector current $I_{Q1C}$ of an output transistor Q1 within a current output branch), when a control or input reference voltage $V_{REF}$ applied to an input transistor Q2 in a current input branch $I_{QNC}$ is restricted within a prescribed input range.

Figure 1:
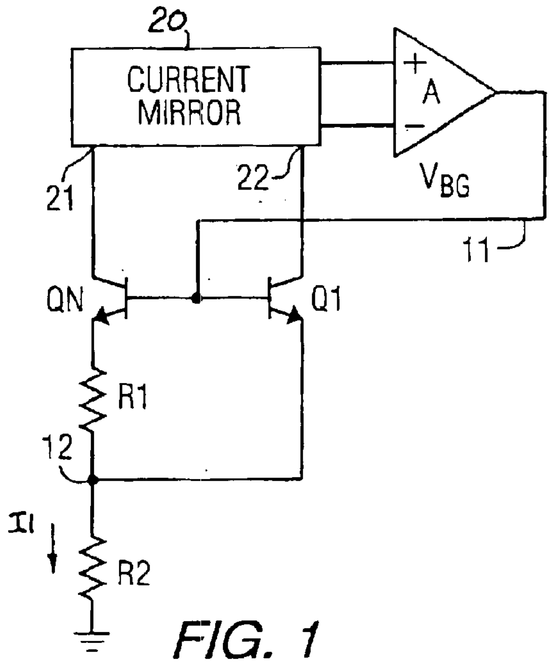
FIG. 1 PRIOR ART
FIG. 1 diagrammatically illustrates a conventional Brokaw bandgap voltage reference circuit, which generates an output voltage that is substantially independent of temperature.
Figure 2:
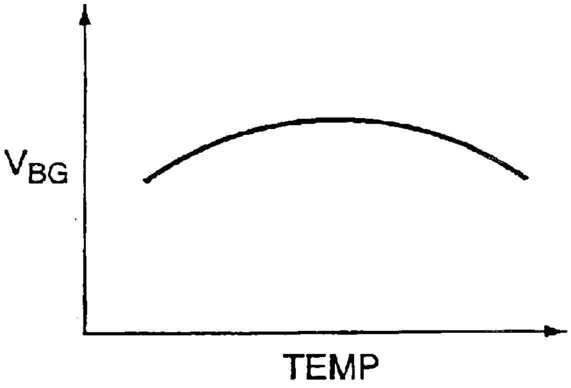
FIG. 2 PRIOR ART
FIG. 2 graphically illustrates the first-order compensated temperature coefficient exhibited by the Brokaw bandgap voltage reference circuit of FIG. 1.
Figure 5:
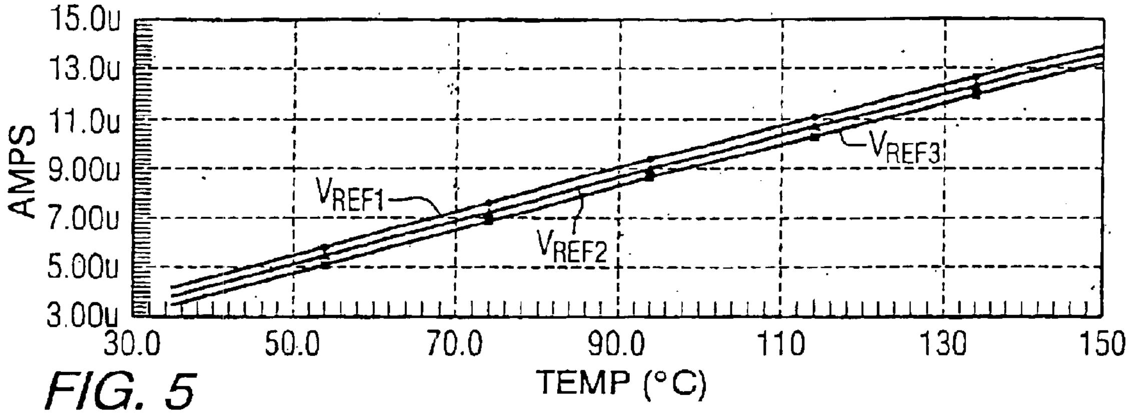
FIG. 5 shows the linear variation with temperature of the output current produced by the circuit of FIG. 3 for different values of base voltage applied to the control transistor Q2.

In accordance with the modified Brokaw cell based circuit of FIG. 3, The collector-emitter current flow path QN of FIG. 1, rather than being connected to a current mirror port, is connected in series with the collector-emitter current flow path of an input or control (NPN) transistor Q2, the collector of which is coupled to power supply rail VCC. The emitter of transistor QN is coupled to series-connected resistors R1 and R2 to GND. The base of the input transistor Q2 is is coupled to receive an input or 'reference' (control) voltage VREF, whose value defines a limited range of variation of output current as shown in FIG. 5. As in the Brokaw circuit of FIG. 1, the output transistor Q1 has its emitter coupled to the common connection of resistors R1 and R2, and its base coupled in common with the base of the diode-connected transistor QN. The collector of output transistor Q1 is coupled to an input port 31 of a current mirror 30, which mirrors the collector current from output transistor Q1 at output port 32.

The current generator of FIG. 3 operates as follows. Unlike the conventional Brokaw circuit of FIG. 1, whose output is 'voltage' and whose input is a 'current' supplied by a current mirror connected to two the legs of the voltage reference circuit, the output of the circuit of FIG. 3 is a 'current' that varies linearly with temperature, and its input is a control 'voltage' applied to the base of control transistor Q2.

For a given reference voltage applied to its base, control transistor Q2 will produce a prescribed (PTAT) output current I1, which is applied to the collector-emitter current flow path of transistor QN and thereby to resistors R1 and R2. The collector current of output transistor Q1 is defined in accordance with the sum of the voltage drop $V_{R1}$ across resistor R1 and the base emitter voltage $Vbe_{QN}$ of transistor QN. Since the voltage variation across resistor R1 is PTAT (and is dominant) and that of the $Vbe_{QN}$ of transistor QN is CTAT, the resultant $Vbe_{Q1}$ of output transistor Q1 is the sum of a dominant PTAT component and a CTAT component, and has a linear temperature coefficient.

Figure 6:
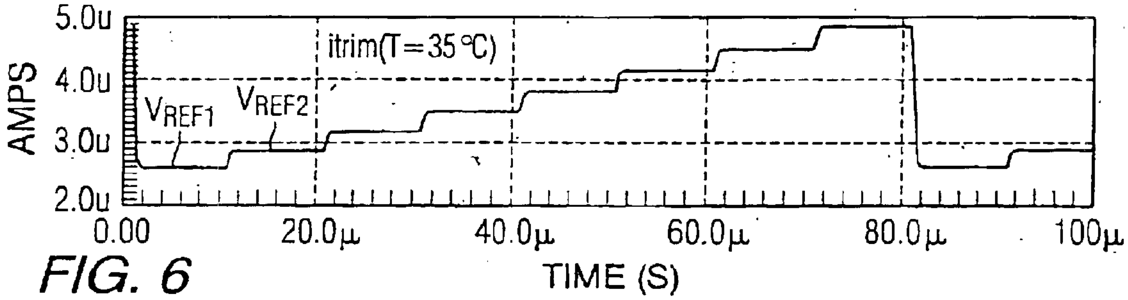
FIGS. 6 and 7 show step changes in output current produced by the circuit of FIG. 3 for different values of base voltage applied to the control transistor Q2 at respectively different operating temperatures.
Figure 7:
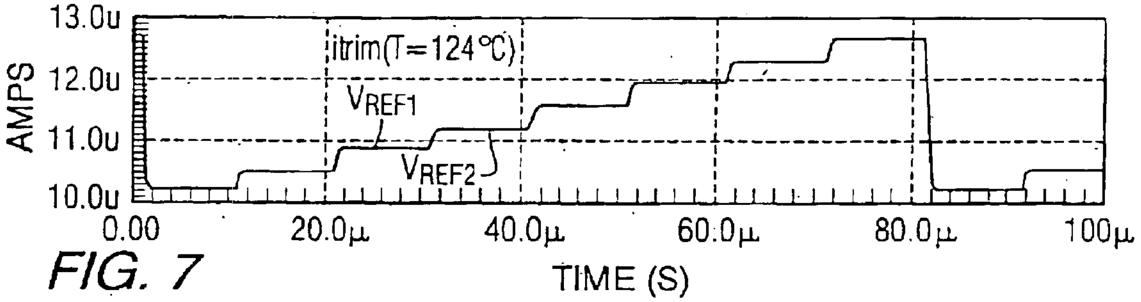

Operational conditions, such as slope and DC offset, of the current generator of the present invention may be selectively defined in accordance one or more parameters or relationships among parameters of the circuit of FIG. 3. For example, the slope of the linear variation of the output current with temperature may be varied by varying the ratio of the emitter areas of transistors Q1 and QN and/or by the ratio of the values of resistors R1/R2. As pointed out above with reference to FIG. 5, and as further illustrated in FIGS. 6 and 7, for a given temperature, the output current may be varied by changing the magnitude of the control voltage applied to the base of control transistor Q2. FIGS. 6 and 7 show stepwise variations in control voltage producing corresponding stepwise changes in output current at respective temperatures of T=35° C. and T=124° C., respectively.

Figure 8:
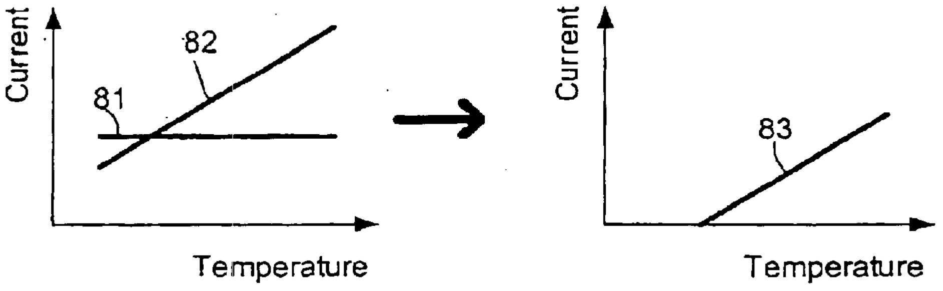
FIG. 8 shows respective output currents whose variations with temperature have a zero slope, and a substantial positive slope, respectively, as well as a composite characteristic realized by combining the two currents.

The ability of the invention to produce an output current that exhibits a very linear variation with temperature makes its readily adaptable to a variety of applications requiring customized temperature-based current behavior characteristics. For example, multiple current generators of the present invention having different parameter settings may be combined to produce a composite piecewise linear variation with temperature. As a non-limiting example, FIG. 8 shows a first output current 81 whose variation with temperature has a zero slope, and a second output current 82 having a substantial positive slope over its linear temperature variation. The composite characteristic shown in FIG. 8 may be achieved by differentially combining the two currents 81 and 82 (as by using an inverting 1:1 current mirror to invert the output current 82) to realize a resultant piecewise linear current 83.

While I have shown and described several embodiments in accordance with the present invention, it is to be understood that the same is not limited thereto but is susceptible to numerous changes and modifications as known to a person skilled in the art. I therefore do not wish to be limited to the details shown and described herein, but intend to cover all such changes and modifications as are obvious to one of ordinary skill in the art.

What is claimed:

1. A method of generating a resultant output current comprising the steps of:

(a) providing a plurality of current generators, each of which includes an input transistor, having a controlled current flow path coupled through a PN junction device to a resistor circuit between first and second power supply terminals, and having a control electrode coupled to receive a control voltage, said input transistor supplying to said PN junction device and said resistor circuit a (PTAT) current that is proportional to absolute temperature in accordance with said control voltage, said PN junction device producing a voltage thereacross that is complementary to absolute temperature (CTAT), and an output transistor having an output current flow path therethrough coupled between an output terminal and a common connection of said resistor circuit, and a control electrode thereof coupled to said PN junction device, so that a base-emitter voltage of said output transistor is controlled by a composite of said CTAT voltage of said PN junction device, and a PTAT voltage produced by said PTAT current flowing through said resistor circuit, whereby said output transistor produces an output current having a linear temperature coefficient; and (b) selectively combining output currents produced by said plurality of current generators to realize said resultant output current having a variation with temperature dependent upon variations with temperature of said plurality of current generators.

2. The method according to claim 1, wherein each said resistor circuit comprises series-connected resistors.

3. The method according to claim 1, wherein each respective current generator includes a current mirror having an input coupled to said current flow path of said output transistor, and an output coupled to said output terminal.

4. The method according to claim 1, wherein each said PN junction device comprises a diode-connected transistor.

* * * * *